(12) United States Patent
Chen et al.

(10) Patent No.: US 12,075,637 B2
(45) Date of Patent: Aug. 27, 2024

(54) PEROVSKITE SOLAR CELL AND FABRICATION METHOD THEREOF

(71) Applicant: CONTEMPORARY AMPEREX TECHNOLOGY CO., LIMITED, Ningde (CN)

(72) Inventors: Changsong Chen, Ningde (CN); Juanjuan Sun, Ningde (CN); Limei Zhou, Ningde (CN); Hanfang Li, Ningde (CN); Wenming Guo, Ningde (CN); Zhiqiang Wang, Ningde (CN); Guodong Chen, Ningde (CN); Yongsheng Guo, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/452,101

(22) Filed: Aug. 18, 2023

(65) Prior Publication Data
US 2023/0403869 A1   Dec. 14, 2023

Related U.S. Application Data

(63) Continuation of application No. PCT/CN2022/092192, filed on May 11, 2022.

(51) Int. Cl.
*H10K 30/50*   (2023.01)
*H10K 30/40*   (2023.01)
(Continued)

(52) U.S. Cl.
CPC ............. *H10K 30/50* (2023.02); *H10K 30/40* (2023.02); *H10K 71/12* (2023.02); *H10K 85/50* (2023.02)

(58) Field of Classification Search
None
See application file for complete search history.

(56) References Cited

U.S. PATENT DOCUMENTS

2005/0142283 A1* 6/2005 Kishimoto ......... H10K 85/1135
427/402
2013/0099204 A1* 4/2013 Avouris ................. B82Y 10/00
257/E29.245
(Continued)

FOREIGN PATENT DOCUMENTS

CN   109524548 A   3/2019
CN   111244275 A   6/2020
(Continued)

OTHER PUBLICATIONS

English language machine translation of Zhao et al. (CN 111599926 A). (Year: 2023).*
(Continued)

*Primary Examiner* — Eli S Mekhlin
(74) *Attorney, Agent, or Firm* — ANOVA LAW GROUP, PLLC

(57) ABSTRACT

A perovskite solar cell includes a transparent electrode, an electron transport layer, a perovskite layer, a hole transport layer, and a second electrode in sequence. The perovskite layer includes a main perovskite layer and a two-dimensional perovskite coating layer covering both surface and periphery of the main perovskite layer. The two-dimensional perovskite coating layer includes a first overlay layer disposed between the main perovskite layer and the electron transport layer, a second overlay layer disposed between the main perovskite layer and the hole transport layer, and a third overlay layer covering the periphery of the main perovskite layer.

19 Claims, 1 Drawing Sheet

(51) Int. Cl.
  *H10K 71/12* (2023.01)
  *H10K 85/50* (2023.01)

(56) References Cited

U.S. PATENT DOCUMENTS

2017/0149270 A1* 5/2017 Adams ............... H04B 1/3883
2020/0013974 A1 1/2020 Fukumoto et al.

FOREIGN PATENT DOCUMENTS

| CN | 111599926 A | 8/2020 | |
|---|---|---|---|
| CN | 111640870 A | 9/2020 | |
| CN | 113224239 A | 8/2021 | |
| WO | WO-2014145609 A1 * | 9/2014 | ......... H01L 51/0003 |
| WO | 2019106370 A1 | 6/2019 | |
| WO | 2020163838 A1 | 8/2020 | |

OTHER PUBLICATIONS

Ding et al., Chemical Engineering Journal, 410 (2021) 128328. (Year: 2021).*
The World Intellectual Property Organization (WIPO) International Search Report and Written Opinion for PCT/CN2022/092192 Jan. 18, 2023 15 pages (with translation).
The European Patent Office (EPO) The Extended European Search Report for Application No. 22924565.9 May 13, 2024 12 Pages.
MD Arafat Mahmud et al., :"Double-Sided Surface Passivation of 3D Perovskite Film for High-Efficiency Mixed-Dimens ionalPerovskite Solar Cells", Advanced Functional Materials , Wiley-V CH Veriag GMBH & Co. KGAA, DE,vol. 30 , No. 7, Dec. 18, 2019 (Dec. 18, 2019),pagen/a,XP072406777.
Xiaoyu Yang et al., :"Buried Interfaces in Halide Perovskite Photovoltaics",Advanced Materials ,vol. 33 , No. 7, Jan. 4, 2021 (Jan. 4, 2021) , XP093144563.
Xiaoyu Yang et al., :"Supporting Information:Buried Interfacesin Halide Perovskite Photovoltaies"Advanced Materials, vol. 33 , No. 7 , Jan. 4, 2021(Jan. 4, 2021) , XP093144564.
Wenjing Yu et al., :"Recent advances on interface engineering of perovskite solar cells "Nano Research , Tsinghua University Press , CN, vol. 15 , No. 1, Jun. 25, 2021 (Jun. 25, 2021) , pp. 85-103 , XP037611652.
Ke Xu et al., :"(C7H18N2)Pbl4:A2D Hybrid Perovskite Solid- State Phase Transition Material with Semiconducting Properties " ,Inorganic Chemistry, vol. 60 , No. 14, Jul. 8, 2021 (Jul. 8, 2021) , pp. 10642-10647 , XP093144183.
Kai Zou et al., :"Pyridine Derivatives'Surface Passivation Enables Efficient and Stable Carbon-Based Perovskite Solar Cells" ,ACS Materials Letters , vol. 4 , No. 6, May 6, 2022 (May 6, 2022) , pp. 1101-1111, XP093144534.

* cited by examiner

PEROVSKITE SOLAR CELL AND FABRICATION METHOD THEREOF

CROSS-REFERENCE TO RELATED APPLICATION

This application is a continuation of International Application No. PCT/CN2022/092192, filed on May 11, 2022, the entire content of which is incorporated herein by reference.

TECHNICAL FIELD

This application relates to a perovskite solar cell. In addition, this application also relates to a fabrication method of the perovskite solar cell.

BACKGROUND

In recent years, global energy shortage and environmental pollution problems are becoming more and more prominent, and solar cells are receiving more and more attention as an ideal renewable energy source. Solar cells, also referred to as photovoltaic cells, are apparatuses that convert light energy directly into electrical energy by photoelectric effects or photochemical effects. Perovskite cells, as a new type of solar cells that are widely researched at present, have rapidly featured high photoelectric conversion efficiency in a few years after their appearance, and their highest photoelectric conversion efficiency has exceeded 25%, showing promising prospects for application.

Due to the significant development of perovskite solar cells, higher requirements have been imposed on energy conversion efficiency and long-term stability. However, the existing perovskite films inevitably exhibit various intrinsic defects during the fabrication process. In addition, perovskite materials are intrinsically unstable and prone to decomposition under the influence of light, heat, water, oxygen, and other factors, thereby affecting the performance of perovskite solar cells. Therefore, the existing perovskite solar cells still need to be improved.

SUMMARY

This application has been made in view of the foregoing issues, with an objective to provide a perovskite solar cell with high energy conversion efficiency and good stability.

To achieve the foregoing objective, a first aspect of this application provides a perovskite solar cell. The perovskite solar cell structurally includes a transparent electrode, an electron transport layer, a perovskite layer, a hole transport layer, and a second electrode in sequence, where the perovskite layer includes a main perovskite layer and a two-dimensional perovskite coating layer covering both surface and periphery of the main perovskite layer, the two-dimensional perovskite coating layer including:
a first overlay layer disposed between the main perovskite layer and the electron transport layer;
a second overlay layer disposed between the main perovskite layer and the hole transport layer; and
a third overlay layer covering the periphery of the main perovskite layer.

The main perovskite layer is fully covered, that is, the upper and lower surfaces and the periphery are fully covered, and as compared with perovskite having only upper and lower surfaces covered, the resulting cell device can achieve better long-term stability.

In any embodiment, in the perovskite solar cell, thicknesses of the first overlay layer, the second overlay layer, and the third overlay layer are each independently 1 nm to 30 nm, optionally 3 nm to 10 nm.

The thicknesses of the first overlay layer, the second overlay layer, and the third overlay layer being within the foregoing range can improve photoelectric conversion efficiency of the perovskite solar cell.

A thicker third overlay layer leads to better stability of the perovskite solar cell.

In addition, the thicknesses of the overlay layers can also affect their HOMO energy levels and LUMO energy levels, so their HOMO energy levels and LUMO energy levels can be regulated by regulating their thicknesses, allowing the overlay layers to better match with the main perovskite and charge transport layers in energy level.

In any embodiment, in the perovskite solar cell, LUMO energy level of the first overlay layer is lower than or equal to LUMO energy level of the main perovskite layer, and
an absolute value of a difference between the LUMO energy level of the first overlay layer and the LUMO energy level of the main perovskite layer is within a range of 0 eV to 0.5 eV, optionally within a range of 0.05 eV to 0.3 eV.

In any embodiment, in the perovskite solar cell, LUMO energy level of the first overlay layer is higher than or equal to LUMO energy level of the electron transport layer, and
an absolute value of a difference between the LUMO energy level of the first overlay layer and the LUMO energy level of the electron transport layer is within a range of 0 eV to 0.5 eV, optionally within a range of 0.05 eV to 0.5 eV.

The foregoing relations are present between the LUMO energy levels of the first overlay layer and the main perovskite layer and between the LUMO energy levels of the first overlay layer and the electron transport layer, which helps electrons to migrate more smoothly from the main perovskite layer to the electron transport layer, thereby ensuring the cell open-circuit voltage and improving the photoelectric conversion efficiency of the solar cell.

The LUMO energy level of the first overlay layer can also be adjusted by adjusting its thickness and material.

In any embodiment, in the perovskite solar cell, HOMO energy level of the second overlay layer is higher than or equal to HOMO energy level of the main perovskite layer, and
an absolute value of a difference between the HOMO energy level of the second overlay layer and the HOMO energy level of the main perovskite layer is within a range of 0 eV to 0.3 eV, optionally within a range of 0.05 eV to 0.2 eV.

In any embodiment, in the perovskite solar cell, HOMO energy level of the second overlay layer is lower than or equal to HOMO energy level of the hole transport layer, and
an absolute value of a difference between the HOMO energy level of the second overlay layer and the HOMO energy level of the hole transport layer is within a range of 0 eV to 0.3 eV, optionally within a range of 0.05 eV to 0.15 eV.

The foregoing relations are present between the HOMO energy levels of the second overlay layer and the main perovskite layer and between the HOMO energy levels of the second overlay layer and the hole transport layer, which helps holes to migrate more smoothly from the main perovskite layer to the hole transport layer, thereby ensuring the cell open-circuit voltage and improving the photoelectric conversion efficiency of the cell.

In any embodiment, in the perovskite solar cell, overlay materials of the first overlay layer, the second overlay layer and the third overlay layer are each independently selected from halogen salts of at least one of the following substances or derivatives thereof:

ethylamine, propylamine, butylamine, pentylamine, hexylamine, isobutylamine, isopentylamine, 3-buten-1-amine, 3-butyn-1-amine, 2-(methylthio)ethylamine, 2-hydroxyethylamine, 2-chloroethylamine, 2-bromoethylamine, 2-iodoethylamine, 2-fluoroethylamine, 2,2-difluoroethylamine, and 2,2,2-trifluoroethylamine;

$H_3NC_mH_{2m+1}$, where m is selected from 7 to 10, 12, 14, 16, and 18;

methylhydrazine;

cyclopropylamine, cyclobutylamine, cyclopentylamine, and cyclohexylamine;

benzylamine, phenylethylamine, 2-naphthylmethylamine, and 2-naphthylethylamine;

2-(1-naphthyloxy)ethylamine, 2-(1-naphthyloxy)propylamine, and 2-(1-naphthyloxy)butylamine;

2-(1-methoxypyrenyl)ethylamine, 2-(1-methoxypyrenyl)propylamine, and 2-(1-methoxypyrenyl)butylamine;

perylenoxyethanamine;

3-phenyl-2-propen-1-amine; and 9-anthracenemethanamine, 4-fluorophenethylamine, 2-fluorophenethylamine, 3-fluorophenethylamine, 4-fluorophenethylamine, perfluorophenethylamine, 2-chlorophenethylamine, 2-bromophenethylamine, 4-fluorobenzylamine, 4-chlorobenzylamine, 4-bromobenzylamine, 4-iodobenzylamine, 3-aminopyrrolidine, piperazine, 1-ethylpiperazine, 1H-imidazole-4-ethanamine, 1-(3-aminopropyl)-1-imidazole, 3-(2-aminoethyl)-1-imidazole, 3-(aminomethyl)piperidine, 4-(aminomethyl)piperidine, 3-(aminomethyl)pyridine, 4-(aminomethyl)pyridine, 4-(aminoethyl)pyridine, phenylene dimethylamine, formamidinium iodide, imidazole, 1-methylimidazole, and 1,2,4-triazole.

The halogen salt may be an iodine salt, a bromine salt, or a chlorine salt, and optionally an iodine salt.

In actual operation, a material for covering the main perovskite is in a form of an ionic compound. Therefore, the overlay layer material may take the form of a salt, and theoretically, all salts causing no influence on the operation are selectable, in some embodiments, a halogen salt. Then, the salt is allowed to be in direct contact with the main perovskite layer.

Cations of the overlay layer material are mainly embedded as A-site ions in the main perovskite or in a B—X (B and X in perovskite $ABX_3$, such as lead iodide) framework, and as hydrophobic organic cations, they are less volatile and thus have good stability.

In any embodiment, in the perovskite solar cell, one of the first overlay layer and the second overlay layer is formed from the overlay material and a halogenated metal salt; and optionally, molar ratio of the overlay material to the halogenated metal salt is within a range of 1:0.9 to 1:1.3, and more optionally within a range of 1:1.05 to 1:1.2.

The molar ratio of the overlay material and the halogenated metal salt (such as lead iodide) affects the energy level of the resulting overlay layer and thus affects the performance of the solar cell. Therefore, the energy level of the overlay layer can be adjusted by adjusting the overlay material and the halogenated metal salt within the foregoing molar ratio range, so as to achieve better performance of the solar cell.

In any embodiment, the halogenated metal salt is selected from at least one of lead iodide, lead bromide, or lead chloride, optionally lead iodide.

A second aspect of this application provides a method for fabricating perovskite solar cell. The method includes a step of fabricating or preparing a transparent electrode, a step of fabricating an electron transport layer, a step of fabricating a perovskite layer, a step of fabricating a hole transport layer, and a step of fabricating a second electrode, where the perovskite layer includes a main perovskite layer and a two-dimensional perovskite coating layer covering both surface and periphery of the main perovskite layer, the two-dimensional perovskite coating layer including:

a first overlay layer disposed between the main perovskite layer and the electron transport layer;

a second overlay layer disposed between the main perovskite layer and the hole transport layer; and a third overlay layer covering the periphery of the main perovskite layer.

The foregoing description of the perovskite solar cell in this application is also applicable to the method for fabricating perovskite solar cell.

In any embodiment, the step of fabricating a perovskite layer includes the following operations:

(1) applying an overlay layer material and a halogenated metal salt on the electron transport layer or the hole transport layer to obtain a primer overlay layer;

(2) applying a material for fabricating main perovskite on the primer overlay layer to obtain the main perovskite layer;

(3) applying an overlay layer material on the main perovskite layer to obtain a surface overlay layer, where any one of the primer overlay layer and the surface overlay layer is the first overlay layer, and the other is the second overlay layer;

(4) applying a protective layer material on the surface overlay layer to obtain a protective layer;

(5) adding a solution of overlay layer material to the protective layer, allowing the solution to flow to peripheries of the main perovskite layer and the protective layer so as to fully cover the periphery, and performing heating to obtain a periphery overlay layer as the third overlay layer; and (6) removing the protective layer.

During the fabrication of the third overlay layer of the perovskite solar cell, this application creatively uses the protective layer, which makes the fabrication of the third overlay layer more controllable and also facilitates adjustment in the thickness and the material.

The perovskite solar cell described in this application can be fabricated by using conventional technical approaches in the art. Optionally, the perovskite layer (including the three overlay layers and the main perovskite layer) is fabricated in at least one of the following methods: chemical bath deposition method, electrochemical deposition method, chemical vapor deposition method, physical epitaxial growth method, co-deposition method, atomic layer deposition method, precursor solution spin coating method (spin coating) method, precursor solution slit coating method, precursor solution scraping method, and mechanical pressing method, optionally a thermal evaporation method and a precursor solution coating (spin coating) method.

In any embodiment, in the method for fabricating perovskite solar cell, the overlay layer materials of (1), (3), and (5) are each independently selected from halogen salts of at least one of the following substances or derivatives thereof:

ethylamine, propylamine, butylamine, pentylamine, hexylamine, isobutylamine, isopentylamine, 3-buten-1-amine, 3-butyn-1-amine, 2-(methylthio)ethylamine, 2-hydroxyethylamine, 2-chloroethylamine, 2-bromoethylamine, 2-iodoethylamine, 2-fluoroethylamine, 2,2-difluoroethylamine, and 2,2,2-trifluoroethylamine;

$H_3NC_mH_{2m+1}$, where m is selected from 7 to 10, 12, 14, 16, and 18;

methylhydrazin;

cyclopropylamine, cyclobutylamine, cyclopentylamine, and cyclohexylamine;

benzylamine, phenylethylamine, 2-naphthylmethylamine, and 2-naphthylethylamine;

2-(1-naphthyloxy)ethylamine, 2-(1-naphthyloxy)propylamine, and 2-(1-naphthyloxy)butylamine;

2-(1-methoxypyrenyl)ethylamine, 2-(1-methoxypyrenyl)propylamine, and 2-(1-methoxypyrenyl)butylamine;

perylenoxyethanamine;

3-phenyl-2-propen-1-amine; and 9-anthracenemethanamine, 4-fluorophenethylamine, 2-fluorophenethylamine, 3-fluorophenethylamine, 4-fluorophenethylamine, perfluorophenethylamine, 2-chlorophenethylamine, 2-bromophenethylamine, 4-fluorobenzylamine, 4-chlorobenzylamine, 4-bromobenzylamine, 4-iodobenzylamine, 3-aminopyrrolidine, piperazine, 1-ethylpiperazine, 1H-imidazole-4-ethanamine, 1-(3-aminopropyl)-1-imidazole, 3-(2-aminoethyl)-1-imidazole, 3-(aminomethyl)piperidine, 4-(aminomethyl)piperidine, 3-(aminomethyl)pyridine, 4-(aminomethyl)pyridine, 4-(aminoethyl)pyridine, phenylene dimethylamine, formamidinium iodide, imidazole, 1-methylimidazole, and 1,2,4-triazole.

In any embodiment, in the method for fabricating perovskite solar cell, in (1), molar ratio of the overlay layer material to the halogenated metal salt is within a range of 1:0.9 to 1:1.3, optionally within a range of 1:1.05 to 1:1.2.

In any embodiment, in the method for fabricating perovskite solar cell, the halogenated metal salt is selected from at least one of lead iodide, lead bromide, or lead chloride, optionally lead iodide.

In any embodiment, the coating application is performed by spin coating, co-evaporation or evaporation; and optionally, in (4), the coating application is performed by spin coating, and after completion of the spin coating, heating is performed to obtain the protective layer.

In any embodiment, in (6), a solvent is used to dissolve the protective layer; optionally, the solvent for dissolving the protective layer is trifluoroethanol; and the protective layer and substances on the protective layer are then removed by spinning.

In any embodiment, the protective layer material is lead pyridine-2-carboxylate.

A third aspect of this application provides an electric apparatus including the perovskite solar cell described in this application or a perovskite solar cell fabricated by using the method for fabricating perovskite solar cell described in this application.

DESCRIPTION OF EMBODIMENTS

Figure 1:
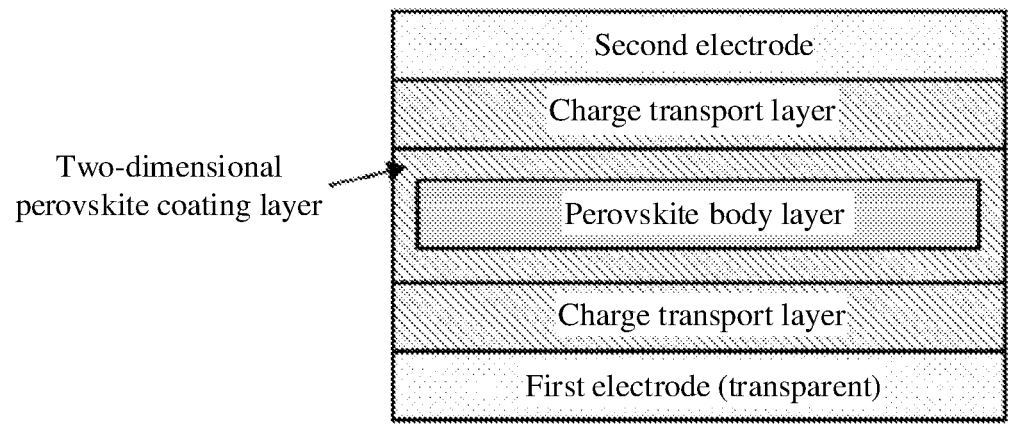
FIG. 1 is a schematic diagram of a structure of a perovskite solar cell. In the figure, from bottom to top, the perovskite solar cell sequentially includes a transparent electrode, a charge transport layer, a perovskite body layer (that is, a main perovskite layer), a two-dimensional perovskite coating layer covering the periphery of the perovskite body layer, a charge transport layer, and a second electrode, where the two charge transport layers are different, being an electron transport layer and a hole transport layer, respectively. This schematic diagram shows that the two-dimensional perovskite coating layer fully covers upper and lower surfaces and the periphery of the perovskite body layer.

The following specifically discloses in detail embodiments of the perovskite solar cell with appropriate reference to the accompanying drawings. However, there may be cases where unnecessary detailed descriptions are omitted. For example, detailed descriptions of well-known matters and repeated descriptions of actually identical structures have been omitted. This is to avoid unnecessarily prolonging the following description, for ease of understanding by persons skilled in the art. In addition, the accompanying drawings and the following descriptions are provided for persons skilled in the art to fully understand this application and are not intended to limit the subject matter recorded in the claims.

"Ranges" disclosed in this application are defined in the form of lower and upper limits. A given range is defined by one lower limit and one upper limit selected, where the selected lower and upper limits define boundaries of that particular range. Ranges defined in this method may or may not include end values, and any combinations may be used, meaning any lower limit may be combined with any upper limit to form a range. For example, if ranges of 60-120 and 80-110 are provided for a specific parameter, it is understood that ranges of 60-110 and 80-120 can also be envisioned. In addition, if minimum values of a range are given as 1 and 2, and maximum values of the range are given as 3,4, and 5, the following ranges can all be envisioned: 1-3, 1-4, 1-5, 2-3, 2-4, and 2-6. In this application, unless otherwise stated, a value range of "a-b" is a short representation of any combination of real numbers between a and b, where both a and b are real numbers. For example, a value range of "0-5" means that all real numbers in the range of "0-5" are listed herein, and "0-5" is just a short representation of a combination of these values. In addition, a parameter expressed as an integer greater than or equal to 2 is equivalent to disclosure that the parameter is, for example, an integer among 2, 3, 4, 5, 6, 7, 8, 9, 10, 11, 12, and so on.

Unless otherwise specified, all the embodiments and optional embodiments of this application can be combined with each other to form new technical solutions.

Unless otherwise specified, all the technical features and optional technical features of this application can be combined with each other to form new technical solutions.

Unless otherwise specified, all the steps in this application can be performed in the order described or in random order, and optionally, in the order described. For example, a method including steps (a) and (b) indicates that the method may include steps (a) and (b) performed in order or may include steps (b) and (a) performed in order. For example, the foregoing method may further include step (c), which indicates that step (c) may be added to the method in any ordinal position, for example, the method may include steps (a), (b), and (c), steps (a), (c), and (b), steps (c), (a), and (b), or the like.

Unless otherwise specified, "include" and "contain" mentioned in this application are inclusive. For example, the terms "include" and "contain" can mean that other unlisted components may or may not also be included or contained.

Unless otherwise specified, in this application, the term "or" is inclusive. For example, the phrase "A or B" means "A, B, or both A and B". More specifically, any one of the following conditions satisfies the condition "A or B": A is true (or present) and B is false (or not present); A is false (or not present) and B is true (or present); or both A and B are true (or present).

Fabrication of a perovskite solar cell includes fabrication of a perovskite layer. However, the surfaces of typically fabricated perovskite films inevitably exhibit intrinsic defects such as vacancy defects, interstitial defects, and anti-site defects, and these defects cause migration, escape and degradation of composition ions in perovskite, especially composition ions at site A, such as methylamine and formamidine ions. In addition, water, oxygen, ultraviolet light, and the like in the air or environment can run through the charge transport layer (the electron transport layer and/or the hole transport layer) to reach the perovskite layer, and their contact with the perovskite may cause degradation and decomposition of the perovskite. These problems make the structure of the perovskite prone to damage and easily cause failure of solar cell devices.

Through research on the foregoing problems, it is currently considered that a key to resolving the foregoing problems lies in suppressing the surface defects and ion migration of the perovskite and blocking the water, oxygen, ultraviolet light, and the like in the environment. An ideal solution to resolve the foregoing problem is to cover the surface of the perovskite (for ease of description, the non-covered perovskite is referred to as "main perovskite" below) with a two-dimensional perovskite coating layer. The intrinsic stability of the two-dimensional perovskite coating layer is excellent and even superior to intrinsic stability of the two-dimensional perovskite material. In addition, the two-dimensional perovskite coating layer covering main perovskite can block water, oxygen, ultraviolet light, and the like; and an interface is formed between the two-dimensional perovskite coating layer and a main perovskite layer, with interface stability improved. In addition, fully covering the upper and lower surfaces and the periphery of the main perovskite layer can significantly improve the stability of the perovskite solar cell.

Therefore, a first aspect of this application provides a perovskite solar cell. The perovskite solar cell structurally includes a transparent electrode, an electron transport layer, a perovskite layer, a hole transport layer, and a second electrode (also referred to as a "counter electrode") in sequence, where the perovskite layer includes a main perovskite layer and a two-dimensional perovskite coating layer covering both surface and periphery of the main perovskite layer, the two-dimensional perovskite coating layer including:

a first overlay layer disposed between the main perovskite layer and the electron transport layer;

a second overlay layer disposed between the main perovskite layer and the hole transport layer; and a third overlay layer covering the periphery of the main perovskite layer.

The perovskite solar cell described in this application may include a transparent electrode, an electron transport layer, a perovskite layer, a hole transport layer, and a second electrode in sequence from bottom to top. As shown in FIG. 1, the sunlight enters from the transparent electrode at the bottom. The perovskite solar cell may alternatively include a transparent electrode, a hole transport layer, a perovskite layer, an electron transport layer, and a second electrode in sequence from top to bottom. The transparent electrode is an electrode used for light incidence.

In terms of structure, perovskite can be classified into two types: layered perovskite and non-layered perovskite. Layered perovskite is constituted by one or more inorganic layers regularly arranged, of which the most representative structures are Ruddlesden-Popper (RP) and Dion-Jacobson (DJ) stack structures, with better environmental stability and structural adjustability than non-layered perovskite. Changes in the structure of perovskite can affect its overall physical properties, such as band gap and exciton binding energy. Therefore, the overall physical properties of the perovskite are typically adjusted by adjusting its structure. Single-layer or few-layer perovskite is defined as a novel two-dimensional material. Unlike the conventional two-dimensional inorganic material, the single-layer perovskite is constituted by flexible and dynamically changeable lattices, and their chemical structures are highly adjustable, so large amounts of novel two-dimensional material with customizable features can be obtained. This provides more diversity for the layered perovskite.

In this application, a two-dimensional perovskite coating layer is used to fully cover main perovskite.

According to first-principles calculation results, band gap of two-dimensional perovskite is larger than band gap of three-dimensional perovskite, and the band gap gradually increases as layers of the two-dimensional perovskite decrease, so high-energy ultraviolet photons can be absorbed, thereby protecting an internal main three-dimensional perovskite layer. In addition, formation energy of the two-dimensional perovskite is lower than formation energy of the three-dimensional perovskite, so the thermodynamic stability of the two-dimensional perovskite is higher than thermodynamic stability of the three-dimensional perovskite, and as the layers of two-dimensional perovskite decrease, the formation energy gradually decreases and the thermodynamic stability is improved.

In addition to the foregoing advantages, the two-dimensional perovskite coating layer described in this application can block external water and oxygen erosion and suppress migration of perovskite ions, thereby reducing light-induced degradation of perovskite. In addition, the two-dimensional perovskite layer has excellent intrinsic stability and, when covering the surface of main perovskite to form an interface with the main perovskite, can improve stability of the interface against water, oxygen, ultraviolet light, and the like. Therefore, the perovskite layer described in this application is suitable for matching with the electron transport layer or hole transport layer that is less capable of blocking water, oxygen, and ultraviolet light.

Compared with a one-dimensional perovskite layer, the two-dimensional perovskite coating layer has better conductivity. The two-dimensional perovskite coating layer described in this application is formed using the following processes and mechanisms.

Co-evaporation of $PbI_2$ and hexylammonium iodide is used as an example. In a procedure of fabricating a primer overlay layer by using, for example, a thermal evaporation process, solid powder of the two salts is used as an evaporation source, and the two salts are evaporated in a molecular form at a specified vacuum degree and temperature, meet in the air or at a substrate above, and undergo chemical combination to form a two-dimensional layered perovskite structure deposited on the surface of the substrate. When a surface overlay layer and a periphery overlay layer are fabricated using, for example, a spin coating process, hexylammonium iodide is applied on both the surface and periphery of the main perovskite layer through spin-coating and then heated and annealed. Excess $PbI_2$ is present in the main perovskite layer, which can undergo chemical combination with hexylammonium iodide embedded in the superficial surface to form a two-dimensional layered perovskite structure.

Figure 2:
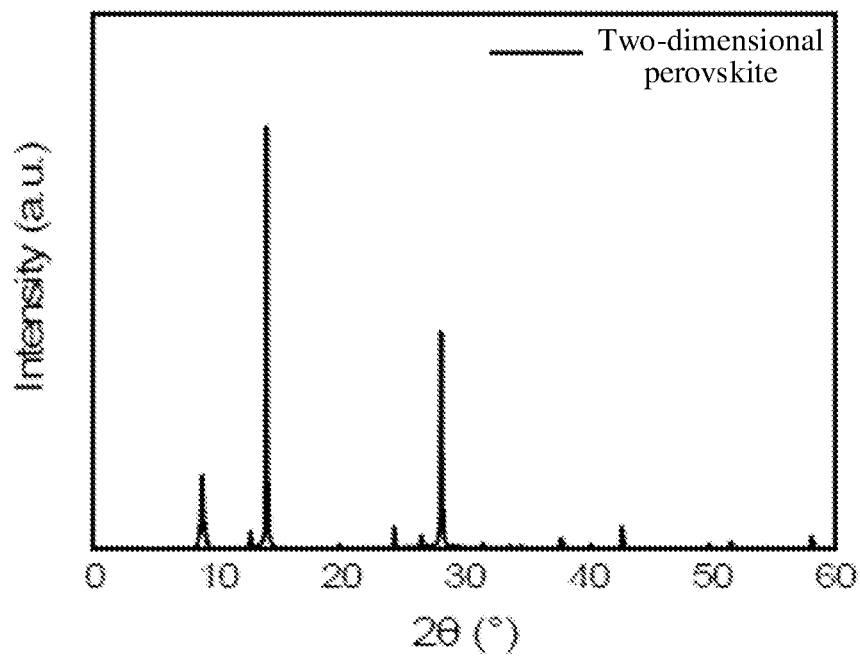
FIG. 2 is an X-ray diffraction pattern of a surface layer (a second overlay layer) of a two-dimensional perovskite coating layer fabricated in example I-1 of this application. In the figure, a first peak is a structural peak of a two-dimensional perovskite layer, and all subsequent peaks are structural peaks of a main perovskite layer.

FIG. 2 is an X-ray diffraction pattern of a surface layer (second overlay layer) of a two-dimensional perovskite coating layer fabricated in example I-1 of this application, which proves that a two-dimensional perovskite layer is formed in this application.

In addition, the main perovskite layer is fully covered, that is, the upper and lower surfaces and the periphery are fully covered, and as compared with perovskite having only upper and lower surfaces covered, the resulting cell device can achieve better long-term stability.

In some embodiments, in the perovskite solar cell, thicknesses of the first overlay layer, the second overlay layer, and the third overlay layer are each independently 1 nm to 30 nm, optionally 3 nm to 10 nm.

The thicknesses of the first overlay layer, the second overlay layer, and the third overlay layer being within the foregoing range can improve photoelectric conversion efficiency of the perovskite solar cell.

A thicker third overlay layer leads to better stability of the perovskite solar cell.

In addition, the thicknesses of the overlay layers can also affect their HOMO energy levels and LUMO energy levels, so their HOMO energy levels and LUMO energy levels can be regulated by regulating their thicknesses, allowing the overlay layers to better match with the main perovskite and charge transport layers.

With the two-dimensional perovskite coating layer described in this application used, a passivation layer is optionally no longer used to passivate the main perovskite layer.

In some embodiments, in the perovskite solar cell, LUMO energy level of the first overlay layer is lower than or equal to LUMO energy level of the main perovskite layer, and an absolute value of a difference between the LUMO energy level of the first overlay layer and the LUMO energy level of the main perovskite layer is within a range of 0 eV to 0.5 eV, optionally within a range of 0.05 eV to 0.3 eV.

In some embodiments, in the perovskite solar cell, LUMO energy level of the first overlay layer is higher than or equal to LUMO energy level of the electron transport layer, and an absolute value of a difference between the LUMO energy level of the first overlay layer and the LUMO energy level of the electron transport layer is within a range of 0 eV to 0.5 eV, optionally within a range of 0.05 eV to 0.5 eV.

The foregoing relations are present between the LUMO energy levels of the first overlay layer and the main perovskite layer and between the LUMO energy levels of the first overlay layer and the electron transport layer, which helps electrons to migrate more smoothly from the main perovskite layer to the electron transport layer, thereby ensuring the cell open-circuit voltage and improving the photoelectric conversion efficiency of the solar cell.

The LUMO energy level of the first overlay layer can also be adjusted by adjusting its thickness and material.

In some embodiments, in the perovskite solar cell, HOMO energy level of the second overlay layer is higher than or equal to HOMO energy level of the main perovskite layer, and an absolute value of a difference between the HOMO energy level of the second overlay layer and the HOMO energy level of the main perovskite layer is within a range of 0 eV to 0.3 eV, optionally within a range of 0.05 eV to 0.2 eV.

In some embodiments, in the perovskite solar cell, HOMO energy level of the second overlay layer is lower than or equal to HOMO energy level of the hole transport layer, and an absolute value of a difference between the HOMO energy level of the second overlay layer and the HOMO energy level of the hole transport layer is within a range of 0 eV to 0.3 eV, optionally within a range of 0.05 eV to 0.15 eV.

The foregoing relations are present between the HOMO energy levels of the second overlay layer and the main perovskite layer and between the HOMO energy levels of the second overlay layer and the hole transport layer, which helps holes to migrate more smoothly from the main perovskite layer to the hole transport layer, thereby ensuring the cell open-circuit voltage and improving the photoelectric conversion efficiency of the cell.

In some embodiments, in the perovskite solar cell, overlay materials of the first overlay layer, the second overlay layer and the third overlay layer are each independently selected from halogen salts of at least one of the following substances or derivatives thereof:

ethylamine, propylamine, butylamine, pentylamine, hexylamine, isobutylamine, isopentylamine, 3-buten-1-amine, 3-butyn-1-amine, 2-(methylthio)ethylamine, 2-hydroxyethylamine, 2-chloroethylamine, 2-bromoethylamine, 2-iodoethylamine, 2-fluoroethylamine, 2,2-difluoroethylamine, and 2,2,2-trifluoroethylamine;

$H_3NC_mH_{2m+1}$, where m is selected from 7 to 10, 12, 14, 16, and 18;

methylhydrazine;

cyclopropylamine, cyclobutylamine, cyclopentylamine, and cyclohexylamine;

benzylamine, phenylethylamine, 2-naphthylmethylamine, and 2-naphthylethylamine;

2-(1-naphthyloxy)ethylamine, 2-(1-naphthyloxy)propylamine, and 2-(1-naphthyloxy)butylamine;

2-(1-methoxypyrenyl)ethylamine, 2-(1-methoxypyrenyl) propylamine, and 2-(1-methoxypyrenyl)butylamine;

perylenoxyethanamine;

3-phenyl-2-propen-1-amine; and 9-anthracenemethanamine, 4-fluorophenethylamine, 2-fluorophenethylamine, 3-fluorophenethylamine, 4-fluorophenethylamine, perfluorophenethylamine, 2-chlorophenethylamine, 2-bromophenethylamine, 4-fluorobenzylamine, 4-chlorobenzylamine, 4-bromobenzylamine, 4-iodobenzylamine, 3-aminopyrrolidine, piperazine, 1-ethylpiperazine, 1H-imidazole-4-ethanamine, 1-(3-aminopropyl)-1-imidazole, 3-(2-aminoethyl)-1-imidazole, 3-(aminomethyl)piperidine, 4-(aminomethyl)piperidine, 3-(aminomethyl)pyridine, 4-(aminomethyl)pyridine, 4-(aminoethyl)pyridine, phenylene dimethylamine, formamidinium iodide, imidazole, 1-methylimidazole, and 1,2,4-triazole.

The halogen salt may be an iodine salt, a bromine salt, or a chlorine salt, and optionally an iodine salt.

In actual operation, a material for covering the main perovskite is in a form of an ionic compound. Therefore, the overlay layer material may take the form of a salt, and theoretically, all salts causing no influence on the operation are selectable, in some embodiments, a halogen salt. Then, the salt is allowed to be in direct contact with the main perovskite layer.

Cations of the overlay layer material are mainly embedded as A-site ions in the main perovskite or in a B—X (for example, Pb—I) framework, and as hydrophobic organic cations, they are less volatile and thus have good stability.

As mentioned above, some specific cations (for example, cations having alkyl chains or hydrocarbon functional groups) are introduced, which are embedded as A-site ions in a superficial layer of a three-dimensional perovskite layer (that is, the main perovskite layer) and enter the B—X (for example, Pb—I) framework, to form a two-dimensional structure. Two-dimensional perovskites formed by different A-site ions have adjustable band gaps and energy band positions, so this feature can further be used to optimize energy level matching inside the cell by varying the type and quantity of the introduced cations.

In some embodiments, in the perovskite solar cell, one of the first overlay layer and the second overlay layer is formed from the overlay material and a halogenated metal salt; and optionally, molar ratio of the overlay material to the halogenated metal salt is within a range of 1:0.9 to 1:1.3, optionally within a range of 1:1.05 to 1:1.2.

The molar ratio of the overlay material and the halogenated metal salt (such as lead iodide) affects the energy level of the resulting overlay layer and thus affects the performance of the solar cell. Therefore, the energy level of the overlay layer can be adjusted by adjusting the overlay material and the halogenated metal salt within the foregoing molar ratio range, so as to achieve better performance.

In a case that one of the first overlay layer and the second overlay layer is formed from the overlay material and the halogenated metal salt, the other of the first overlay layer and the second overlay layer is formed from the overlay layer material without use of the halogenated metal salt. In actual operation, in the first overlay layer and the second overlay layer, the layer fabricated earlier is a primer layer, and during a fabrication process of the primer layer, the overlay layer material and the halogenated metal salt are used for forming a two-dimensional perovskite structure by optionally using a co-evaporation method; and the layer fabricated later is a surface layer, and during a fabrication process of the surface layer, the overlay layer material is used alone without the halogenated metal salt. This is because excess X anions typically present in the fabricated main perovskite layer can interact with the overlay layer material to form a surface overlay layer. In a case that the fabricated main perovskite layer does not have excess X anions or has insufficient X anions, an X anion salt, for example, the halogenated metal salt, may be added as appropriate during the fabrication of the surface layer.

In some embodiments, the halogenated metal salt is selected from at least one of lead iodide, lead bromide, or lead chloride, optionally lead iodide.

A second aspect of this application provides a method for fabricating perovskite solar cell. The method includes a step of fabricating or preparing a transparent electrode, a step of fabricating an electron transport layer, a step of fabricating a perovskite layer, a step of fabricating a hole transport layer, and a step of fabricating a second electrode, where the perovskite layer includes a main perovskite layer and a two-dimensional perovskite coating layer covering both surface and periphery of the main perovskite layer, the two-dimensional perovskite coating layer including:
    a first overlay layer disposed between the main perovskite layer and the electron transport layer;
    a second overlay layer disposed between the main perovskite layer and the hole transport layer; and
    a third overlay layer covering the periphery of the main perovskite layer.

The foregoing description of the perovskite solar cell in this application is also applicable to the method for fabricating perovskite solar cell.

In some embodiments, the step of fabricating a perovskite layer includes the following operations.

(1) An overlay layer material and a halogenated metal salt are applied on the electron transport layer or the hole transport layer to obtain a primer overlay layer.

(2) A material for fabricating main perovskite is applied on the primer overlay layer to obtain the main perovskite layer.

(3) an overlay layer material is applied on the main perovskite layer to obtain a surface overlay layer, where any one of the primer overlay layer and the surface overlay layer is the first overlay layer, and the other is the second overlay layer.

(4) A protective layer material is applied on the surface overlay layer to obtain a protective layer.

(5) A solution of overlay layer material is added to the protective layer, the solution is allowed to flow to peripheries of the main perovskite layer and the protective layer so as to fully cover the periphery, and heating is performed to obtain a periphery overlay layer as the third overlay layer.

(6) The protective layer is removed.

Optionally, the protective layer has a thickness of 1 nm to 10 nm.

During the fabrication of the third overlay layer of the perovskite solar cell, this application creatively uses the protective layer, which makes the fabrication of the third overlay layer more controllable and also facilitates adjustment in the thickness and the material.

The perovskite solar cell described in this application can be fabricated by using conventional technical approaches in the art. Optionally, the perovskite layer (including the three overlay layers and the main perovskite layer) is fabricated in at least one of the following methods: chemical bath deposition method, electrochemical deposition method, chemical vapor deposition method, physical epitaxial growth method, co-deposition method, atomic layer deposition method, precursor solution spin coating method (spin coating) method, precursor solution slit coating method, precursor solution scraping method, and mechanical pressing method, optionally a thermal evaporation method and a precursor solution coating (spin coating) method. The fabrication method of perovskite layer is not specifically limited in this application, as long as it can achieve the desired purpose. Optionally, the coating application described in this application is performed in the foregoing method.

Optionally, the coating application in (1) is performed in a co-evaporation method. The "co-evaporation" described in this application can be performed using powder of two or more substances as an evaporation source. The formation of perovskite is used as an example. Powder of corresponding substances, as the evaporation source, is evaporated in a molecular form at a specified vacuum degree and temperature, and these molecules meet in the air or at a substrate and undergo chemical combination to form a perovskite structure deposited on the surface of the substrate.

In some embodiments, in the method for fabricating perovskite solar cell, the overlay layer materials of (1), (3), and (5) are each independently selected from halogen salts of at least one of the following substances or derivatives thereof:

ethylamine, propylamine, butylamine, pentylamine, hexylamine, isobutylamine, isopentylamine, 3-buten-1-amine, 3-butyn-1-amine, 2-(methylthio)ethylamine, 2-hydroxyethylamine, 2-chloroethylamine, 2-bromoethylamine, 2-iodoethylamine, 2-fluoroethylamine, 2,2-difluoroethylamine, and 2,2,2-trifluoroethylamine;

$H_3NC_mH_{2m+1}$, where m is selected from 7 to 10, 12, 14, 16, and 18;

methylhydrazine;

cyclopropylamine, cyclobutylamine, cyclopentylamine, and cyclohexylamine;

benzylamine, phenyl ethylamine, 2-naphthyl methylamine, and 2-naphthylethylamine;

2-(1-naphthyloxy)ethylamine, 2-(1-naphthyloxy)propylamine, and 2-(1-naphthyloxy)butylamine;

2-(1-methoxypyrenyl)ethylamine, 2-(1-methoxypyrenyl)propylamine, and 2-(1-methoxypyrenyl)butylamine;

perylenoxyethanamine;

3-phenyl-2-propen-1-amine; and 9-anthracenemethanamine, 4-fluorophenethylamine, 2-fluorophenethylamine, 3-fluorophenethylamine, 4-fluorophenethylamine, perfluorophenethylamine, 2-chlorophenethylamine, 2-bromophenethylamine, 4-fluorobenzylamine, 4-chlorobenzylamine, 4-bromobenzylamine, 4-iodobenzylamine, 3-aminopyrrolidine, piperazine, 1-ethylpiperazine, 1H-imidazole-4-ethanamine, 1-(3-aminopropyl)-1-imidazole, 3-(2-aminoethyl)-1-imidazole, 3-(aminomethyl)piperidine, 4-(aminomethyl)piperidine, 3-(aminomethyl)pyridine, 4-(aminomethyl)pyridine, 4-(aminoethyl)pyridine, phenylene dimethylamine, formamidinium iodide, imidazole, 1-methylimidazole, and 1,2,4-triazole.

In this application, the terms "overlay layer material" and "overlay material" are used synonymously.

In some embodiments, in the method for fabricating perovskite solar cell, in (1), molar ratio of the overlay layer material to the halogenated metal salt is within a range of 1:0.9 to 1:1.3, optionally within a range of 1:1.05 to 1:1.2.

In some embodiments, in the method for fabricating perovskite solar cell, the halogenated metal salt is selected from at least one of lead iodide, lead bromide, or lead chloride, optionally lead iodide.

In some embodiments, the coating application is performed by spin coating, co-evaporation or evaporation; and optionally, in (4), the coating application is performed by spin coating, and after completion of the spin coating, heating is performed to obtain the protective layer.

In some embodiments, in (6), a solvent is used to dissolve the protective layer; optionally, the solvent for dissolving the protective layer is trifluoroethanol; and the protective layer and substances on the protective layer are then removed by spinning.

In some embodiments, the protective layer material is lead pyridine-2-carboxylate.

In some optional embodiments, the protective layer may not be used during the fabrication of the periphery overlay layer (that is, the third overlay layer), and the surface overlay layer and the periphery overlay layer can be fabricated at the same time. In this case, the surface two-dimensional perovskite overlay layer and the periphery perovskite overlay layer have the same A-site ions. A specific operation instance is as follows: During the fabrication of the surface overlay layer, an excess solution of overlay material (for example, an isopropanol solution of hexylammonium iodide) is added (which can be added in a spin coating method), and the solution is allowed to not only cover the main perovskite layer but also flow to the periphery of the main perovskite layer and fully cover the periphery, followed by heating and annealing, to obtain both the surface overlay layer and the periphery overlay layer in a form of two-dimensional perovskite.

A third aspect of this application provides an electric apparatus including the perovskite solar cell described in this application or a perovskite solar cell fabricated by using the method for fabricating perovskite solar cell described in this application.

The following briefly describes structures of the main perovskite layer, the electron transport layer, the hole transport layer and the electrodes of the perovskite solar cell, but this application is not limited thereto.

Main Perovskite Layer

The main perovskite layer can be fabricated from any perovskite material conventionally used in the art.

Optionally, an $ABX_3$-type main perovskite is used in this application, where A represents an inorganic, organic, or organic-inorganic hybrid cation, B represents an inorganic, organic, or organic-inorganic hybrid cation, and X represents an inorganic, organic, or organic-inorganic hybrid anion. For example, the A-site ion may be, for example, a methylamine cation $MA^+$, a formamidine cation $FA^+$, $Cs^+$, or a mixture thereof; the B-site ion may be, for example, $Pb^{2+}$, $Sn^{2+}$, or a mixture thereof; and the X-site ion may be a halogen ion, $COO^-$ or a mixture thereof.

Optionally, the main perovskite layer can be fabricated in an evaporation method, for example, using single crystals of $FAPbI_3$.

Transparent Electrode and Second Electrode

The transparent electrode and the second electrode described in this application may be any electrodes used in the art. Optionally, electrode material of the transparent electrode and the second electrode is an organic, inorganic, or organic-inorganic hybrid conductive material. For example, the organic conductive material may be a conductive polymer, for example, poly(3,4-ethylenedioxythiophene) (PEDOT), polythiophene, or polyacetylene. The inorganic conductive material may be: transparent conductive oxide, for example, fluorine-doped tin oxide (FTO), indium tin oxide (ITO), or aluminum-doped zinc oxide (AZO); metals; or carbon derivatives.

The transparent electrode is used for light incidence. A transparent conductive oxide is usually used. Typically, the transparent conductive oxide is constituted by a glass substrate and an oxide film (TCO for short) conductive layer. The TCO conventionally used includes ITO, FTO, and AZO, but this application is not limited thereto.

The conductive glass needs to be washed before use. For example, the conductive glass is subjected to ultrasonic washing with a washing agent (for example, the washing agent includes but is not limited to a surfactant), ethanol, acetone, isopropanol, and deionized water.

The second electrode, which is used to collect charge carriers, is selected from metals or carbon derivatives and fabricated in a method that is a technical method known in the art, for example, a thermal evaporation method, with a thickness of 20 nm to 1000 nm. In a specific embodiment of this application, the second electrode is fabricated from metallic silver in an evaporation method, with a thickness of 50 nm to 120 nm.

Hole Transport Layer

The hole transport layer is used to collect and extract holes from the perovskite layer. Any hole transport layer material conventionally used in the art can be used, and optionally, a hole transport layer material satisfying the foregoing HOMO energy level matching relation can be used.

Optionally, for example, the material of the hole transport layer is at least one of the following materials and derivatives thereof: poly[bis(4-phenyl)(2,4,6-trimethylphenyl)amine] (PTAA), 2,2',7,7'-tetra[N,N-bis(4-methoxyphenyl)amino]-9,9'-spirobifluorene (Spiro-OMeTAD), poly(3-hexylthiophene) (P3HT), tritylene-nucleated triphenylamine (H101), 3,4-ethylenedioxythiophene-methoxytriphenylamine (EDOT-OMe TPA), N-(4-anilino)carbazole-spirobifluorene (CzPAF-SBF), poly(3,4-ethylenedioxythiophene)thiophene):poly(styrene sulfonic acid) (PEDOT:PSS), polythiophene, nickel oxide ($NiO_x$), molybdenum oxide ($MoO_3$), cuprous iodide (CuI), and cuprous oxide ($Cu_2O$).

Thickness of the hole transport layer may be within a range of 5 nm to 300 nm, optionally within a range of 100 nm to 200 nm.

Electron Transport Layer

The electron transport layer is used to collect and extract electrons from the perovskite layer. The electron transport layer can use any electron transport layer material used in the art, optionally an electron transport layer material satisfying the foregoing HOMO energy level matching relation.

Optionally, for example, the material of the electron transport layer is at least one of the following materials and derivatives thereof: [6,6]-phenyl-$C_{61}$-butyric acid methyl ester ($PC_{61}BM$), [6,6]-phenyl-$C_{71}$-butyric acid methyl ester ($PC_{71}BM$), fullerene C60 (C60), fullerene C70 (C70), tin dioxide ($SnO_2$), zinc oxide (ZnO), and titanium dioxide ($TiO_2$).

Thickness of the electron transport layer may be within a range of 5 nm to 200 nm, optionally within a range of 20 nm to 100 nm.

Both the hole transport layer and the electron transport layer can be fabricated using methods conventionally used in the field.

EXAMPLES

The following describes examples of this application. The examples described below are illustrative and only used for explaining this application, and cannot be construed as limitations on this application. Examples whose technical solutions or conditions are not specified are made in accordance with technical solutions or conditions described in literature in the field or made in accordance with product instructions. The reagents or instruments used are all conventional products that are commercially available if no manufacturer is indicated.

I. Fabrication of Perovskite Solar Cell

Example I-1

[Transparent Electrode]

The surface of a piece of FTO conductive glass with a size of 2.0 cm×2.0 cm was washed twice with acetone and isopropanol in sequence. Then, the piece of FTO conductive glass was immersed in deionized water for ultrasonic treatment for 10 min, dried in an air blast drying oven, and then placed in a glove box ($N_2$ atmosphere) for later use. A transparent electrode was obtained.

[Electron Transport Layer]

A 3 wt % $SnO_2$ nanocolloid aqueous solution was applied through spin-coating for 30 seconds on an FTO film layer of the transparent electrode using a spin coater (referred to as LEBO EZ6-S below). Then, the FTO film layer was heated at 150° C. for 15 min on a constant-temperature heating table, and an electron transport layer with a thickness of 30 nm was obtained.

[Perovskite Layer]

Step 1: A two-dimensional perovskite primer layer (a first overlay layer) was fabricated.

The foregoing sample with the transparent electrode and the electron transport layer formed was put into a vacuum coater. Hexylammonium iodide and $PbI_2$ were co-evaporated at a molar ratio of 1:1.1 on the surface of the electron transport layer under a vacuum condition of $5 \times 10^{-4}$ Pa, so that the two substances underwent chemical combination to form a perovskite structure and deposited on the surface of the sample, where an evaporation rate ratio of the two substances was 1:1 (at an evaporation rate of 0.1 Å/s). A two-dimensional perovskite primer layer with a thickness of 5 nm was obtained.

Step 2: A main perovskite layer was fabricated.

Then, the evaporation source was changed to $FAPbI_3$ single crystals. An $FAPbI_3$ main perovskite layer with a thickness of 500 nm was evaporated on the surface of the two-dimensional perovskite primer layer obtained in step 1.

Step 3: A two-dimensional perovskite surface layer (second overlay layer) was fabricated.

Then, an isopropanol solution of hexylammonium iodide at a concentration of 5 mg/mL was applied through spin-coating for 30 s on the surface of the $FAPbI_3$ main perovskite layer using the spin coater at a speed of 5000 rpm, followed by heating at 100° C. for 10 min on the constant-temperature heating table to obtain a two-dimensional perovskite surface layer with a thickness of 5 nm.

Step 4: A protective layer was added.

Then, a trifluoroethanol solution of lead pyridine-2-carboxylate at a concentration of 5 mg/mL was applied through spin-coating on the surface of the two-dimensional perovskite surface layer fabricated in step 3 using the spin coater at the speed of 5000 rpm such that the surface of the surface layer was fully covered with the trifluoroethanol solution, followed by heating at 100° C. for 10 min on the constant-temperature heating table to obtain a protective layer.

Step 5: A periphery overlay layer (a third overlay layer) was added.

Then, an electric grinder (Bosch GSR120) was used to grind and trim peripheries of the protective layer and the perovskite layer of the sample obtained in step 4, and the protective layer/perovskite layer with four sides removed had a width of 1 mm. Then, the isopropanol solution of hexylammonium iodide at the concentration of 5 mg/mL was applied through spin-coating on the surface of the protective layer of the obtained sample using the spin coater at the speed of 5000 rpm such that the solution could flow to the ground periphery and fully covered the periphery, and then the sample was heated at 100° C. for 10 min on the constant-temperature heating table; and a two-dimensional perovskite periphery overlay layer with a thickness of about 5 nm was obtained.

Then, 100 µL of excess trifluoroethanol solution was added dropwise to dissolve the protective layer, and then the spin coater was used, spinning at a speed of 6000 rpm, to remove the protective layer and substances on the protective layer, followed by heating at 100° C. for 5 min on the constant-temperature heating table.

Finally, a perovskite layer fully covered with two-dimensional perovskite was obtained.

[Hole Transport Layer]

A chlorobenzene solution of Spiro-OMeTAD at a concentration of 73 mg/mL was applied through spin-coating for 20 seconds on the obtained heterojunctional perovskite layer using the spin coater at the speed of 5000 rpm, and a hole transport layer with a thickness of 150 nm was obtained.

[Second Electrode]

The sample with the transparent electrode, the electron transport layer, the perovskite layer, and the hole transport layer formed was put into a vacuum coater, and Ag was evaporated on the surface of the obtained hole transport layer under the vacuum condition of $5 \times 10^{-4}$ Pa. An Ag electrode with a thickness of 80 nm was obtained and served as a second electrode.

In this way, the perovskite solar cell of example I-1 was obtained.

Examples I-2 to I-7 and Comparative Example

The fabrication of examples I-2 to I-7 and comparative example was similar to the fabrication of example I-1 except for the thickness of the periphery overlay layer in step 5 of the fabrication of [perovskite layer]. For specific details, refer to Table 1.

II. Second Overlay Layer Energy Level Matching Investigation

Examples II-1 to II-11

Examples II-1 to II-11 were similar to example I-1, except for the difference shown in Table 2, where the three overlay layers have the same thickness, with thickness values given in Table 2.

III. First Overlay Layer Energy Level Matching Investigation

Examples III-1 to III-13

Examples III-1 to III-13 were similar to example II-1, with the difference shown in Table 3, where the three overlay layers have the same thickness, with thickness values given in Table 3.

IV. Cell Performance Test

Performance tests were performed on the perovskite solar cells in the examples and the comparative example.

1. Energy Conversion Efficiency Test

The energy conversion efficiency of the perovskite solar cells in the examples and the comparative example was tested. Under an atmospheric environment, the AM1.5G standard light source was used as a solar simulator, and a four-channel digital source meter (Keithley 2440) was used to measure a voltammetric curve of the cell under light irradiation. Open-circuit voltage Voc, short-circuit current density Jsc, and fill factor FF (Fill Factor) of the cell were obtained, from which the energy conversion efficiency Eff (Efficiency) of the cell was calculated.

The energy conversion efficiency was calculated as follows:

$$Eff = Pout/Popt$$

$$= Voc \times Jsc \times (Vmpp \times Jmpp)/(Voc \times Jsc)$$

$$= Voc \times Jsc \times FF,$$

where Pout, Popt, Vmpp, and Jmpp are cell operating output power, incident light power, cell voltage at maximum power point, and current at maximum power point, respectively.

In this test, the open-circuit voltage Voc is the cell open-circuit voltage in Tables 2 to 3.

2. Cell Stability Test

The stability of the perovskite solar cells in the examples and the comparative example was tested. The cell was placed for at least 800 hours with light under an air condition with a relative humidity RH of 75% to 80% and an ambient temperature of 25° C. to 30° C. The energy conversion efficiencies of the cell before and after placement were tested according to the foregoing test method. A ratio of the efficiency of the cell after placement for 800 hours to an initial efficiency was calculated as the cell stability performance parameter.

3. Energy Level Test

At normal temperature and pressure, an Escalab 250Xi X-ray-ultraviolet photoelectron spectrometer (XPS-UPS) (manufactured by Thermo Scientific) was used for testing, so as to obtain energy band distribution of the overlay layers.

4. Test of Thicknesses of the Overlay Layers

Under normal temperature and vacuum conditions, a dual-beam system (FIB-SEM), having a focused ion beam (FIB) coupled with a high-resolution scanning electron microscope (SEM), was used to perform fixed thinning and cross-sectional sample fabrication on the sample, so as to perform thickness test.

Test results are shown in Tables 1 to 3.

TABLE 1

Influence of thickness of periphery overlay layer (that is, third overlay layer) on cell performance

| Example number | Thickness of periphery overlay layer (nm) | Energy conversion efficiency (%) | Efficiency of cell after placement for 800 h (%) | Cell stability (%) |
| --- | --- | --- | --- | --- |
| I-1 | 5 | 21.69 | 21.00 | 96.8 |
| I-2 | 1 | 20.70 | 19.46 | 94.0 |
| I-3 | 3 | 21.30 | 20.45 | 96.0 |
| I-4 | 10 | 20.55 | 19.91 | 96.9 |
| I-5 | 30 | 19.76 | 19.13 | 96.8 |
| I-6 | 33 | 18.92 | 18.33 | 96.9 |
| I-7 | 0.5 | 20.00 | 17.80 | 89.0 |
| Comparative example | 0 | 19.50 | 14.47 | 74.2 |

Results of the foregoing table show that:

As compared with the comparative example with no overlay layer on the periphery, the overlay layer on the periphery can significantly improve the stability of the perovskite solar cell.

A thicker periphery overlay layer (the third overlay layer) leads to a better stability of the solar cell.

When the thickness of the periphery overlay layer is within a range of 1 nm to 30 nm, and more optionally within a range of 3 nm to 10 nm, better energy conversion efficiency and cell stability can be achieved.

TABLE 2

Influence of HOMO energy level matching relation of second overlay layer on cell performance

| Example number | Main perovskite layer HOMO energy level (eV) | Surface layer (second overlay layer) of two-dimensional perovskite coating layer Material | Thickness (nm) | HOMO energy level (eV) | HOMO energy level difference between second overlay layer and main perovskite layer (eV) | Material of hole transport layer | Hole transport layer HOMO energy level (eV) | HOMO energy level difference between second overlay layer and hole transport layer (eV) | Cell Energy conversion efficiency (%) | Cell open-circuit voltage (V) |
|---|---|---|---|---|---|---|---|---|---|---|
| II-1 | −5.4 | Hexylammonium iodide | 9 | −5.20 | 0.20 | Spiro-OMeTAD | −5.2 | 0.00 | 21.4 | 1.08 |
| II-2 | −5.4 | Hexylammonium iodide | 7 | −5.30 | 0.10 | Spiro-OMeTAD | −5.2 | −0.10 | 21.5 | 1.10 |
| II-3 | −5.4 | Hexylammonium iodide | 5 | −5.33 | 0.08 | Spiro-OMeTAD | −5.2 | 0.13 | 21.7 | 1.12 |
| II-4 | −5.4 | Benzylammonium iodide | 6 | −5.28 | 0.12 | Spiro-OMeTAD | −5.2 | −0.08 | 21.4 | 1.09 |
| II-5 | −5.4 | 3-(aminomethyl)piperidinium iodide | 7 | −5.28 | 0.12 | Spiro-OMeTAD | −5.2 | −0.08 | 21.3 | 1.09 |
| II-6 | −5.4 | Hexylammonium iodide | 5 | −5.33 | 0.07 | PTAA | −5.1 | 0.23 | 21.0 | 1.10 |
| II-7 | −5.4 | Hexylammonium iodide | 5 | −5.33 | 0.07 | CuI | −5.2 | −0.13 | 21.3 | 1.11 |
| II-8 | −5.4 | Hexylammonium iodide | 5 | −5.33 | 0.07 | $MoO_3$ | −5.3 | −0.03 | 21.5 | 1.12 |
| II-9 | −5.4 | Hexylammonium iodide | 35 | −5.05 | 0.35 | Spiro-OMeTAD | −5.2 | 0.15 | 20.3 | 0.98 |
| II-10 | −5.4 | Hexylammonium iodide | 50 | −4.90 | 0.50 | Spiro-OMeTAD | −5.2 | 0.30 | 12.0 | 0.90 |
| II-11 | −5.4 | Hexylammonium iodide | 1 | −5.60 | −0.2 | Spiro-OMeTAD | −5.2 | −0.40 | 20.7 | 1.01 |

Results of the foregoing table show that:

The HOMO energy level of the surface layer (that is, the second overlay layer) of the two-dimensional perovskite coating layer is related to its thickness, with a larger thickness leading a higher HOMO energy level.

The HOMO energy level of the surface layer (that is, the second overlay layer) of the two-dimensional perovskite coating layer is related to its material type. Under the same thickness, the HOMO energy level obtained when 3-(aminomethyl)piperidinium and benzylamine cations are used is higher than the HOMO energy level obtained when hexylammonium cations are used.

When the HOMO energy level of the surface layer (that is, the second overlay layer) of the two-dimensional perovskite coating layer is higher than or equal to HOMO energy level of the main perovskite layer, and an absolute value of a difference between the two HOMO energy levels is within a range of 0 eV to 0.3 eV, optionally within a range of 0.05 eV to 0.20 eV, better energy conversion efficiency and cell open-circuit voltage can be achieved.

When the HOMO energy level of the surface layer (that is, the second overlay layer) of the two-dimensional perovskite coating layer is lower than or equal to HOMO energy level of the hole transport layer, and an absolute value of a difference between the two HOMO energy levels is within a range of 0 eV to 0.3 eV, optionally within a range of 0.05 eV to 0.15 eV, better energy conversion efficiency and cell open-circuit voltage can be achieved.

TABLE 3

Influence of LUMO energy level matching relation of first overlay layer on cell performance

| Example number | Main perovskite layer LUMO energy level (eV) | Primer layer (first overlay layer) of two-dimensional perovskite coating layer Material | Molar ratio of material to lead iodide | Thickness (nm) | LUMO energy level (eV) | LUMO energy level difference between primer layer and main perovskite layer (eV) | Electron transport layer LUMO energy level (eV) | LUMO energy level difference between primer layer and electron transport layer (eV) | Energy conversion efficiency (%) | Cell open-circuit voltage (V) |
|---|---|---|---|---|---|---|---|---|---|---|
| III-1 | −4.0 | Hexylammonium iodide | 1:1.10 | 10 | −4.20 | −0.20 | −4.5 | 0.30 | 21.2 | 1.07 |
| III-2 | −4.0 | Hexylammonium iodide | 1:1.10 | 8 | −4.10 | −0.10 | −4.5 | 0.40 | 21.5 | 1.10 |
| III-3 | −4.0 | Hexylammonium iodide | 1:1.10 | 7 | −4.08 | 0.08 | −4.5 | 0.42 | 21.7 | 1.12 |

TABLE 3-continued

Influence of LUMO energy level matching relation of first overlay layer on cell performance

| Example number | Main perovskite layer LUMO energy level (eV) | Primer layer (first overlay layer) of two-dimensional perovskite coating layer | | | | LUMO energy level difference between primer layer and main perovskite layer (eV) | Electron transport layer LUMO energy level (eV) | LUMO energy level difference between primer layer and electron transport layer (eV) | Energy conversion efficiency (%) | Cell open-circuit voltage (V) |
|---|---|---|---|---|---|---|---|---|---|---|
| | | Material | Molar ratio of material to lead iodide | Thickness (nm) | LUMO energy level (eV) | | | | | |
| III-4 | −4.0 | Benzylammonium iodide | 1:1.10 | 20 | −4.42 | −0.42 | −4.5 | 0.08 | 20.5 | 1.04 |
| III-5 | −4.0 | 3-(aminomethyl)piperidinium iodide | 1:1.10 | 22 | −4.42 | −0.42 | −4.5 | 0.08 | 20.4 | 1.04 |
| III-6 | −4.0 | Hexylammonium iodide | 1:1.20 | 7 | −4.20 | −0.20 | −4.5 | 0.30 | 21.3 | 1.07 |
| III-7 | −4.0 | Hexylammonium iodide | 1:1.13 | 7 | −4.10 | −0.10 | −4.5 | 0.40 | 21.5 | 1.11 |
| III-8 | −4.0 | Hexylammonium iodide | 1:1.10 | 7 | −4.08 | −0.08 | −4.5 | 0.42 | 21.7 | 1.12 |
| III-9 | −4.0 | Hexylammonium iodide | 1:1.10 | 2 | −3.65 | 0.35 | −4.5 | 0.85 | 12.0 | 0.85 |
| III-10 | −4.0 | Hexylammonium iodide | 1:0.85 | 7 | −3.70 | 0.30 | −4.5 | 0.80 | 13.5 | 0.88 |
| III-11 | −4.0 | Hexylammonium iodide | 1:1.35 | 7 | −4.65 | −0.65 | −4.5 | −0.15 | 18.9 | 0.98 |
| III-12 | −4.0 | Hexylammonium iodide | 1:1.10 | 35 | −4.70 | −0.70 | −4.5 | −0.20 | 17.3 | 0.93 |
| III-13 | −4.0 | Hexylammonium iodide | 1:1.10 | 1 | −3.70 | 0.30 | −4.5 | 0.80 | 14.2 | 0.90 |

Results of Table 3 show that:

The LUMO energy level of the surface layer (that is, the first overlay layer) of the two-dimensional perovskite coating layer is related to its thickness, with a larger thickness leading to a lower LUMO energy level.

When the thickness of the two-dimensional perovskite primer layer is within a range of 1 nm to 30 nm, optionally within a range of 3 nm to 10 nm, better energy conversion efficiency and cell open-circuit voltage can be achieved.

The LUMO energy level of the surface layer (that is, the first overlay layer) of the two-dimensional perovskite coating layer is related to its material type.

The LUMO energy level of the surface layer (that is, the first overlay layer) of the two-dimensional perovskite coating layer is related to the molar ratio of its material to lead iodide, with a smaller molar ratio leading to a lower LUMO energy level. When the molar ratio of the material of the two-dimensional perovskite primer layer to lead iodide is 1:0.9 to 1:1.3, optionally 1:1.05 to 1:1.2, better energy conversion efficiency and cell open-circuit voltage can be achieved.

When the LUMO energy level of the surface layer (that is, the first overlay layer) of the two-dimensional perovskite coating layer is lower than LUMO energy level of the main perovskite layer, and an absolute value of a difference between the two LUMO energy levels is within a range of 0 eV to 0.5 eV, optionally within a range of 0.05 eV to 0.3 eV, better energy conversion efficiency and cell open-circuit voltage can be achieved.

When the LUMO energy level of the surface layer (that is, the first overlay layer) of the two-dimensional perovskite coating layer is higher than LUMO energy level of the electron transport layer, and an absolute value of a difference between the two LUMO energy levels is within a range of 0 eV to 0.5 eV, optionally within a range of 0.05 eV to 0.5 eV, better energy conversion efficiency and cell open-circuit voltage can be achieved.

It should be noted that this application is not limited to the foregoing embodiments. The foregoing embodiments are merely examples, and embodiments having substantially the same constructions and the same effects as the technical idea within the scope of the technical solutions of this application are all included in the technical scope of this application. In addition, without departing from the essence of this application, various modifications made to the embodiments that can be conceived by persons skilled in the art, and other forms constructed by combining some of the constituent elements in the embodiments are also included in the scope of this application.

What is claimed is:

1. A perovskite solar cell, comprising a transparent electrode, an electron transport layer, a perovskite layer, a hole transport layer, and a counter electrode in sequence;
wherein the perovskite layer comprises a main perovskite layer and a coating layer having two-dimensional perovskite, the coating layer covering both surface and periphery of the main perovskite layer, and the coating layer comprising:
a first overlay layer disposed between the main perovskite layer and the electron transport layer;
a second overlay layer disposed between the main perovskite layer and the hole transport layer; and
a third overlay layer covering the periphery of the main perovskite layer; and wherein:
LUMO energy level of the first overlay layer is lower than or equal to LUMO energy level of the main perovskite layer and an absolute value of a difference between the LUMO energy level of the first overlay layer and the LUMO energy level of the main perovskite layer is within a range of 0.05 eV to 0.42 eV;
the LUMO energy level of the first overlay layer is higher than or equal to LUMO energy level of the electron transport layer and an absolute value of a difference between the LUMO energy level of the first overlay layer and the LUMO energy level of the electron transport layer is within a range of 0.05 eV to 0.5 eV;
HOMO energy level of the second overlay layer is higher than or equal to HOMO energy level of the main perovskite layer and an absolute value of a difference between the HOMO energy level of the second overlay layer and the HOMO energy level of the main perovskite layer is within a range of 0.05 eV to 0.35 eV; or the HOMO energy level of the second overlay layer is lower than or equal to HOMO energy level of the hole transport layer and an absolute value of a difference between the HOMO energy level of the second overlay layer and the HOMO energy level of the hole transport layer is within a range of 0 eV to 0.23 eV.

2. The perovskite solar cell according to claim 1, wherein thicknesses of the first overlay layer, the second overlay layer, and the third overlay layer are each independently 1 nm to 30 nm.

3. The perovskite solar cell according to claim 1, wherein: an absolute value of a difference between the LUMO energy level of the first overlay layer and the LUMO energy level of the main perovskite layer is within a range of 0.05 eV to 0.3 eV.

4. The perovskite solar cell according to claim 1, wherein: an absolute value of a difference between the HOMO energy level of the second overlay layer and the HOMO energy level of the main perovskite layer is within a range of 0.05 eV to 0.2 eV.

5. The perovskite solar cell according to claim 1, wherein: HOMO energy level of the second overlay layer is lower than or equal to HOMO energy level of the hole transport layer; and an absolute value of a difference between the HOMO energy level of the second overlay layer and the HOMO energy level of the hole transport layer is within a range of 0.05 eV to 0.15 eV.

6. The perovskite solar cell according to claim 1, wherein an overlay material of each of the first overlay layer, the second overlay layer, and the third overlay layer is independently selected from halogen salts of at least one of following substances or derivatives thereof:

ethylamine, propylamine, butylamine, pentylamine, hexylamine, isobutylamine, isopentylamine, 3-buten-1-amine, 3-butyn-1-amine, 2-(methylthio)ethylamine, 2-hydroxyethylamine, 2-chloroethylamine, 2-bromoethylamine, 2-iodoethylamine, 2-fluoroethylamine, 2,2-difluoroethylamine, and 2,2,2-trifluoroethylamine;

$H_3NC_mH_{2m+1}$, wherein m is selected from 7 to 10, 12, 14, 16, and 18;

methylhydrazine;

cyclopropylamine, cyclobutylamine, cyclopentylamine, and cyclohexylamine;

benzylamine, phenylethylamine, 2-naphthylmethylamine, and 2-naphthylethylamine;

2-(1-naphthyloxy)ethylamine, 2-(1-naphthyloxy)propylamine, and 2-(1-naphthyloxy)butylamine;

2-(1-methoxypyrenyl)ethylamine, 2-(1-methoxypyrenyl) propylamine, and 2-(1-methoxypyrenyl)butylamine;

perylenoxyethanamine;

3-phenyl-2-propen-1-amine; and 9-anthracenemethanamine, 4-fluorophenethylamine, 2-fluorophenethylamine, 3-fluorophenethylamine, 4-fluorophenethylamine, perfluorophenethylamine, 2-chlorophenethylamine, 2-bromophenethylamine, 4-fluorobenzylamine, 4-chlorobenzylamine, 4-bromobenzylamine, 4-iodobenzylamine, 3-aminopyrrolidine, piperazine, 1-ethylpiperazine, 1H-imidazole-4-ethanamine, 1-(3-aminopropyl)-1-imidazole, 3-(2-aminoethyl)-1-imidazole, 3-(aminomethyl)piperidine, 4-(aminomethyl)piperidine, 3-(aminomethyl)pyridine, 4-(aminomethyl)pyridine, 4-(aminoethyl)pyridine, phenylene dimethylamine, formamidinium iodide, imidazole, 1-methylimidazole, and 1,2,4-triazole.

7. The perovskite solar cell according to claim 6, wherein one of the first overlay layer and the second overlay layer is formed from the overlay material and a halogenated metal salt.

8. The perovskite solar cell according to claim 7, wherein molar ratio of the overlay material to the halogenated metal salt is within a range of 1:0.9 to 1:1.3.

9. The perovskite solar cell according to claim 7, wherein the halogenated metal salt is selected from at least one of lead iodide, lead bromide, or lead chloride.

10. An electric apparatus, comprising the perovskite solar cell according to claim 1.

11. The perovskite solar cell according to claim 1, wherein an overlay material of each of the first overlay layer, the second overlay layer, and the third overlay layer is independently selected from halogen salts of at least one of following substances or derivatives thereof:

ethylamine, propylamine, butylamine, pentylamine, hexylamine, isobutylamine, isopentylamine, 3-buten-1-amine, 3-butyn-1-amine, 2-(methylthio)ethylamine, 2-hydroxyethylamine, 2-chloroethylamine, 2-bromoethylamine, 2-iodoethylamine, 2-fluoroethylamine, 2,2-difluoroethylamine, and 2,2,2-trifluoroethylamine;

$H_3NC_mH_{2m+1}$, wherein m is selected from 7 to 10, 12, 14, 16, and 18;

methylhydrazine;

cyclopropylamine, cyclobutylamine, cyclopentylamine, and cyclohexylamine;

benzylamine, phenylethylamine, 2-naphthylmethylamine, and 2-naphthylethylamine;

2-(1-naphthyloxy)ethylamine, 2-(1-naphthyloxy)propylamine, and 2-(1-naphthyloxy)butylamine;

2-(1-methoxypyrenyl)ethylamine, 2-(1-methoxypyrenyl) propylamine, and 2-(1-methoxypyrenyl)butylamine;

perylenoxyethanamine;

3-phenyl-2-propen-1-amine; and 9-anthracenemethanamine, 4-fluorophenethylamine, 2-fluorophenethylamine, 3-fluorophenethylamine, 4-fluorophenethylamine, perfluorophenethylamine, 2-chlorophenethylamine, 2-bromophenethylamine, 4-fluorobenzylamine, 4-chlorobenzylamine, 4-bromobenzylamine, 4-iodobenzylamine, 3-aminopyrrolidine, piperazine, 1-ethylpiperazine, 1H-imidazole-4-ethanamine, 1-(3-aminopropyl)-1-imidazole, 3-(2-aminoethyl)-1-imidazole, 3-(aminomethyl)piperidine, 4-(aminomethyl)piperidine, 3-(aminomethyl)pyridine, 4-(aminomethyl)pyridine, 4-(aminoethyl)pyridine, phenylene dimethylamine, imidazole, 1-methylimidazole, and 1,2,4-triazole.

12. A method for fabricating perovskite solar cell, comprising fabricating or preparing a transparent electrode, fabricating an electron transport layer, fabricating a perovskite layer, fabricating a hole transport layer, and fabricating a counter electrode;

wherein the perovskite layer comprises a main perovskite layer and a coating layer having two-dimensional perovskite, the coating layer covering both surface and periphery of the main perovskite layer, and the coating layer comprising:

a first overlap layer disposed between the main perovskite layer and the electron transport layer;

a second overlay layer disposed between the main perovskite layer and the hole transport layer; and a third overlay layer covering the periphery of the main perovskite layer; and wherein:

LUMO energy level of the first overlay layer is lower than or equal to LUMO energy level of the main perovskite layer and an absolute value of a difference between the LUMO energy level of the first overlay layer and the LUMO energy level of the main perovskite layer is within a range of 0.05 eV to 0.42 eV;

LUMO energy level of the first overlay layer is higher than or equal to LUMO energy level of the electron transport layer and an absolute value of a difference between the LUMO energy level of the first overlay layer and the LUMO energy level of the electron transport layer is within a range of 0.05 eV to 0.5 eV;

HOMO energy level of the second overlay layer is higher than or equal to HOMO energy level of the main perovskite layer and an absolute value of a difference between the HOMO energy level of the second overlay layer and the HOMO energy level of the main perovskite layer is within a range of 0.05 eV to 0.35 eV; or the HOMO energy level of the second overlay layer is lower than or equal to HOMO energy level of the hole transport layer and an absolute value of a difference between the HOMO energy level of the second overlay layer and the HOMO energy level of the hole transport layer is within a range of 0 eV to 0.23 eV.

13. The method for fabricating perovskite solar cell according to claim 12, wherein fabricating the perovskite layer comprises:
(1) applying an overlay layer material and a halogenated metal salt on the electron transport layer or the hole transport layer to obtain a primer overlay layer as one of the first overlay layer and the second overlay layer;
(2) applying a material for fabricating main perovskite on the primer overlay layer to obtain the main perovskite layer;
(3) applying an overlay layer material on the main perovskite layer to obtain a surface overlay layer as another one of the first overlay layer and the second overlay layer;
(4) applying a protective layer material on the surface overlay layer to obtain a protective layer;
(5) adding a solution of overlay layer material to the protective layer, allowing the solution to flow to periphery of the main perovskite layer and the protective layer so as to fully cover the periphery, and performing heating to obtain a periphery overlay layer as the third overlay layer; and
(6) removing the protective layer.

14. The method for fabricating perovskite solar cell according to claim 13, wherein the halogenated metal salt is selected from at least one of lead iodide, lead bromide, or lead chloride.

15. The method for fabricating perovskite solar cell according to claim 13, wherein the overlay layer material, the halogenated metal salt, the material for fabricating main perovskite, and the protective layer material application are each applied by spin coating, co-evaporation, or evaporation.

16. The method for fabricating perovskite solar cell according to claim 13, wherein in (6), a solvent is used to dissolve the protective layer, and the protective layer and substances on the protective layer are removed by spinning.

17. The method for fabricating perovskite solar cell according to claim 13, wherein the protective layer material is lead pyridine-2-carboxylate.

18. An electric apparatus, comprising a perovskite solar cell fabricated by using the method according to claim 12.

19. A method for fabricating perovskite solar cell, comprising fabricating or preparing a transparent electrode, fabricating an electron transport layer, fabricating a perovskite layer, fabricating a hole transport layer, and fabricating a counter electrode;
wherein the perovskite layer comprises a main perovskite layer and a coating layer having two-dimensional perovskite, the coating layer covering both surface and periphery of the main perovskite layer, and the coating layer comprising:
a first overlay layer disposed between the main perovskite layer and the electron transport layer;
a second overlay layer disposed between the main perovskite layer and the hole transport layer; and
a third overlay layer covering the periphery of the main perovskite layer; and wherein fabricating the perovskite layer comprises:
(1) applying an overlay layer material and a halogenated metal salt on the electron transport layer or the hole transport layer to obtain a primer overlay layer as one of the first overlay layer and the second overlay layer;
(2) applying a material for fabricating main perovskite on the primer overlay layer to obtain the main perovskite layer;
(3) applying an overlay layer material on the main perovskite layer to obtain a surface overlay layer as another one of the first overlay layer and the second overlay layer;
(4) applying a protective layer material on the surface overlay layer to obtain a protective layer, the protective layer material being lead pyridine-2-carboxylate;
(5) adding a solution of overlay layer material to the protective layer, allowing the solution to flow to periphery of the main perovskite layer and the protective layer so as to fully cover the periphery, and performing heating to obtain a periphery overlay layer as the third overlay layer; and
(6) removing the protective layer.

* * * * *